United States Patent
Park et al.

(10) Patent No.: US 9,882,156 B2
(45) Date of Patent: Jan. 30, 2018

(54) ORGANIC LIGHT EMITTING DEVICE

(71) Applicant: LG Display Co., Ltd., Seoul (KR)

(72) Inventors: Eun Jung Park, Goyang-si (KR); Byung Soo Kim, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/699,480

(22) Filed: Apr. 29, 2015

(65) Prior Publication Data

US 2015/0311463 A1 Oct. 29, 2015

(30) Foreign Application Priority Data

Apr. 29, 2014 (KR) .................. 10-2014-0051965

(51) Int. Cl.
*H01L 51/50* (2006.01)
*H01L 27/32* (2006.01)

(52) U.S. Cl.
CPC ...... *H01L 51/5004* (2013.01); *H01L 51/5064* (2013.01); *H01L 51/5096* (2013.01); *H01L 27/3211* (2013.01); *H01L 51/5088* (2013.01)

(58) Field of Classification Search
CPC .................................. H01L 51/5004
See application file for complete search history.

(56) References Cited

U.S. PATENT DOCUMENTS

| | | | | |
|---|---|---|---|---|
| 2002/0038860 A1* | 4/2002 | Tsuboyama | ............ | C09K 19/54 252/301.16 |
| 2002/0100906 A1* | 8/2002 | Takiguchi | ............ | C07F 15/0033 257/40 |
| 2005/0186330 A1* | 8/2005 | Kim | .................... | H01L 27/3211 427/66 |
| 2009/0206741 A1* | 8/2009 | Yoon | ..................... | B82Y 10/00 313/504 |
| 2011/0248247 A1* | 10/2011 | Matsumoto | ............ | C09K 11/06 257/40 |
| 2012/0097933 A1* | 4/2012 | Ando | .................... | H01L 51/001 257/40 |
| 2014/0183461 A1* | 7/2014 | Kim | ........................ | H01L 51/56 257/40 |

* cited by examiner

*Primary Examiner* — Lex Malsawma
(74) *Attorney, Agent, or Firm* — Fenwick & West LLP

(57) ABSTRACT

An organic light emitting device comprises a first and a second electrode, an organic light emitting layer disposed between the first and the second electrode, a hole injection layer adjacent to a first electrode, and a common layer disposed on the hole injection layer, wherein the common layer serves as a hole transporting layer and an electron blocking layer.

17 Claims, 4 Drawing Sheets

| classification | structure | Volt | cd/A | CIE_x | CIE_y | EQE(%) |
|---|---|---|---|---|---|---|
| comparative example | HTL + EBL | 4.2 | 5.8 | 0.143 | 0.045 | 13.4 |
| embodiment 1 | common layer 1 | 4.2 | 5.8 | 0.143 | 0.045 | 13.5 |
| embodiment 2 | common layer 2 | 3.7 | 5.7 | 0.143 | 0.045 | 13.3 |
| embodiment 3 | common layer 3 | 3.8 | 5.6 | 0.143 | 0.045 | 13.1 |
| embodiment 4 | common layer 4 | 4.2 | 5.4 | 0.143 | 0.045 | 12.6 |
| embodiment 5 | common layer 5 | 4.3 | 5.9 | 0.143 | 0.045 | 13.7 |

| classification | structure | Volt | cd/A | CIE_x | CIE_y | EQE(%) |
|---|---|---|---|---|---|---|
| embodiment 1 | common layer 1 | 4.7 | 46.5 | 0.670 | 0.327 | 32.6 |
| embodiment 2 | common layer 2 | 4.0 | 47.6 | 0.667 | 0.330 | 32.8 |

| classification | structure | Volt | cd/A | CIE_x | CIE_y | EQE(%) |
|---|---|---|---|---|---|---|
| embodiment 1 | common layer 1 | 4.6 | 109.8 | 0.229 | 0.717 | 30.1 |
| embodiment 2 | common layer 2 | 3.9 | 111.2 | 0.227 | 0.718 | 30.4 |

ORGANIC LIGHT EMITTING DEVICE

CROSS REFERENCE TO RELATED APPLICATIONS

This application claims the benefit of the Korean Patent Application No. 10-2014-0051965 filed on Apr. 29, 2014, which is hereby incorporated by reference for all purposes as if fully set forth herein.

BACKGROUND OF THE INVENTION

Field of the Invention

The present invention relates to an organic light emitting device, and more particularly, to an organic light emitting device, which may be driven at a low voltage and has improved luminescence lifetime.

Discussion of the Related Art

An organic light emitting display (OLED) is a self light emitting display device, and is a display device based on an organic light emitting device that injects electrons and holes from each of a cathode for electron injection and an anode for hole injection into a light emitting layer and emits light when excitons obtained by combination of the injected electrons and holes are transited from an excited state to a ground state.

The organic light emitting display may be categorized into a top emission type, a bottom emission type, and a dual emission type depending on a direction to which light is emitted, and may be categorized into a passive matrix type and an active matrix type depending on a driving mode.

The organic light emitting display may be fabricated to be lightweight and slim in size, as it does not need a separate light source such as a backlight for a liquid crystal display (LCD). Also, the organic light emitting display is favorable in view of power consumption due to low voltage driving and also is excellent for color realization, a response speed, a viewing angle, and a contrast ratio (CR), whereby the organic light emitting display has been studied as a display for next generation applications.

As a display of high resolution has been developed, the number of pixels per unit area has been increased and high luminance has been required. However, there is a limitation in luminance (Cd) of a unit area (A) in view of a luminescent structure of the organic light emitting display, and problems occur in that reliability of the organic light emitting device is deteriorated and power consumption is increased due to increase of an applied current.

Therefore, to overcome such technical limitations that deteriorate the quality and productivity of the organic light emitting device, luminescence efficiency and lifetime of the organic light emitting device need to be improved and power consumption should be reduced. In this respect, various studies for developing an organic light emitting device, which may improve luminescence efficiency, lifetime of an organic light emitting layer and viewing angle characteristics while maintaining a color area, have been made.

SUMMARY OF THE INVENTION

An organic light emitting device according to the related art has a limitation in luminescence characteristics and lifetime performance due to the materials and luminescent structure of an organic light emitting layer. In this respect, various methods for improving luminescence efficiency and lifetime have been suggested. However, if luminance is increased, a problem occurs in that power consumption is increased. Also, if a luminescent material is changed to achieve a longer lifetime, a problem occurs in that luminescence efficiency is lowered.

In the organic light emitting device according to the related art, a hole transporting layer (HTL) is provided to actively inject holes from an anode to an organic light emitting layer, and a material of a low HOMO (Highest Occupied Molecular Orbital) energy level is used as the hole transporting layer to minimize an energy barrier between the hole transporting layer and the organic light emitting layer.

If the material of a low HOMO energy level is applied to the hole transporting layer, a LUMO (Lowest Unoccupied Molecular Orbital) energy level of the hole transporting layer may be lowered in proportion to the HOMO energy level. Therefore, an electron blocking layer may additionally be applied to the structure of the organic light emitting device to prevent electrons from being transmitted to the hole transmitting layer, whereby injection characteristics of the holes, which are required for the organic light emitting device, may be obtained.

However, if the electron blocking layer is used as above, charges are frequently trapped in an interface between two materials of the hole transporting layer and the electron blocking layer. If an N type hole injection layer (N-Type HIL) is used, the HOMO energy level of the hole transporting layer is lowered to disturb charge generation and active movement of the holes, whereby a driving voltage required for luminescence of the organic light emitting device is increased, and lifetime of the organic light emitting device is deteriorated.

Accordingly, the present invention is directed to an organic light emitting device that substantially obviates one or more problems due to limitations and disadvantages of the related art.

An advantage of the present invention is to provide an organic light emitting device, which may be driven at a low voltage and has improved luminescence lifetime.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting device according to the embodiment of the present invention comprises the first and the second electrode; and an organic light emitting layer between the first and the second electrode; a hole injection layer adjacent to the first electrode; and a common layer on the hole injection layer, wherein the common layer serves as a hole transporting layer and an electron blocking layer.

Also, a difference between an absolute value of an energy level of the hole injection layer and an absolute value of an energy level of the first electrode may be larger than or equal to 0.

Also, a difference between the absolute value of the energy level of the hole injection layer and an absolute value of an energy level of the common layer may be larger than or equal to 0.

Also, the difference between the absolute value of the energy level of the hole injection layer and the absolute value of the energy level of the common layer may be larger than or equal to the difference between the absolute value of the energy level of the hole injection layer and the absolute value of the energy level of the first electrode.

The hole injection layer may be made of N type organic material, and the first electrode may be formed of ITO (Indium Tin Oxide).

Also, the common layer may have a HOMO (Highest Occupied Molecular Orbital) energy level higher than or equal to a work function of the first electrode.

The HOMO energy level of the common layer is higher than 5.2 eV.

A LUMO (Lowest Unoccupied Molecular Orbital) energy level of the common layer is higher than 2.3 eV.

Also, the organic light emitting device further comprises a first hole transporting layer corresponding to a red emission layer; and a second hole transporting layer corresponding to a green emission layer, wherein each of the first hole transporting layer and the second hole transporting layer is formed of the same material as that of the common layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
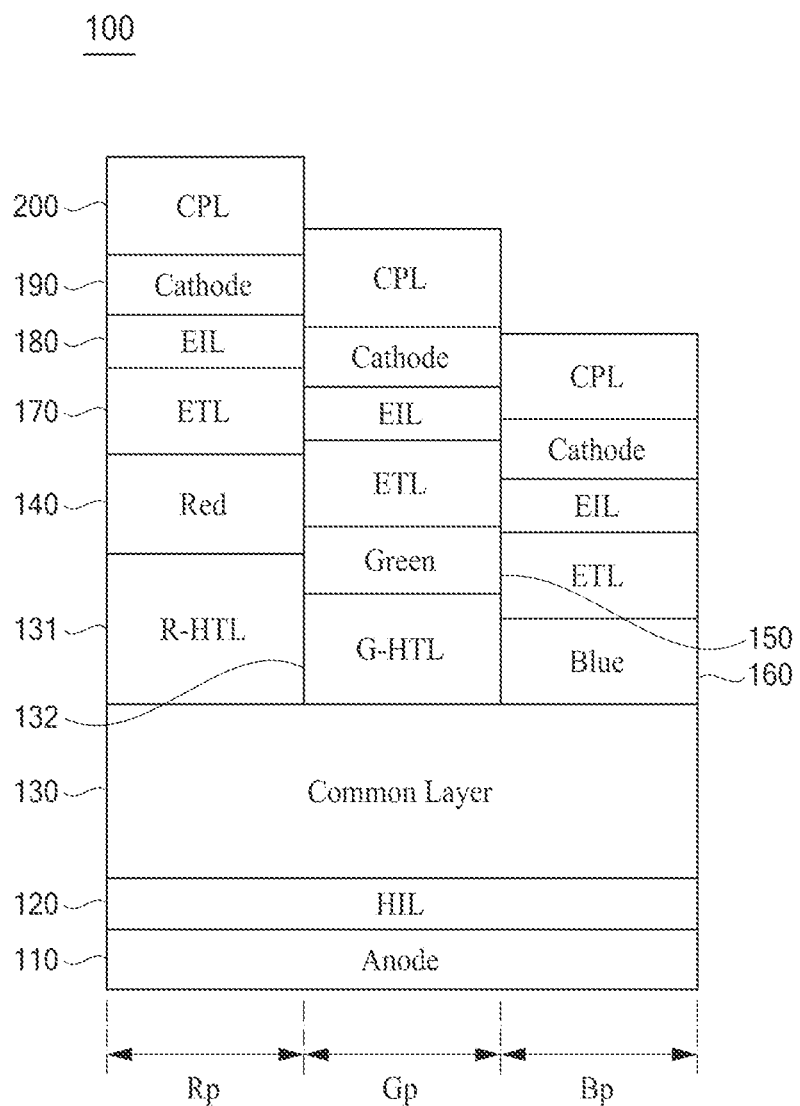
FIG. 1 is a cross-sectional view briefly illustrating an organic light emitting device according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is defined by the scope of the claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, such may include an error range although there is no explicit description. In describing a time relationship, for example, when the temporal order is described as 'after~', 'subsequent~', 'next~' and 'before~', a case which is not continuous may be included unless 'just' or 'direct' is used.

In describing the embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the present invention will be described in detail with reference to the accompanying drawings.

FIG. 1 is a cross-sectional view briefly illustrating an organic light emitting device according to an embodiment of the present invention.

As shown in FIG. 1, the organic light emitting device 100 according to an embodiment of the present invention includes a first electrode 110 (anode) deposited on a substrate in which red, green and blue pixel areas Rp, Gp and Bp are defined, a hole injection layer (HIL) 120, a common layer 130, a first hole transporting layer (R-HTL) 130, a second hole transporting layer (G-HTL) 132, an organic light-emission layer of a red emission layer 140, a green emission layer 150 and a blue emission layer 160, an electron transporting layer (ETL) 170, an electron injection layer (EIL) 180, a second electrode (cathode) 190, and a capping layer 200 (CPL).

Also, in an organic light emitting display that includes the organic light emitting device, a power line is arranged to be extended in parallel with any one of the gate and data lines, which cross each other on the substrate having pixel areas, and a switching thin film transistor (TFT) and a driving thin film transistor (TFT) are arranged in each pixel area, wherein the switching thin film transistor is connected to the gate line and the data line, and the driving thin film transistor is connected to the switching thin film transistor. The driving thin film transistor is connected to the first electrode 110.

The first electrode 110 is formed at the red, green and blue pixel areas, and may be formed as a reflective electrode. For example, the first electrode 110 may include a transparent conductive material layer having a high work function such as indium-tin-oxide (ITO) or a reflective material layer such as Ag or Ag alloy.

The hole injection layer 120 and the common layer 130 are disposed on the first electrode 110 to correspond to all of the red, green and blue pixel areas Rp, Gp and Bp.

The hole injection layer 120 may serve to actively inject holes, and may be made of, but not limited to, one or more selected from a group of HATCN, CuPc(cupper phthalocyanine), PEDOT(poly(3,4)-ethylenedioxythiophene), PANI (polyaniline) and NPD(N,N-dinaphthyl-N,N'-diphenylbenzidine).

The common layer 130 may be referred to as a common hole transporting layer, and at the same time may serve as an electron blocking layer (EBL). The electron blocking layer EBL serves to actively make recombination of holes and electrons within the organic light-emission layer by avoiding (or blocking) the flow of electrons to the hole transporting layer, thereby improving luminescence efficiency of the organic light emitting device.

The first hole transporting layer 131 and the second hole transporting layer 132 are disposed on the common layer 130 and respectively correspond to the red pixel area Rp and the green pixel area Gp.

The common layer 130, the first hole transporting layer 131 and the second hole transporting layer 132 serve to actively transport holes, and may be made of, but not limited to, any one or more selected from a group of NPD(N,N-dinaphthyl-N,N'-diphenylbenzidine), TPD(N,N'-bis-(3-methylphenyl)-N,N'-bis-(phenyl)-benzidine), s-TAD and MTDATA(4,4',4"-Tris(N-3-methylphenyl-N-phenyl-amino)-triphenylamine).

The first hole transporting layer 131 and the second hole transporting layer 132 may be formed of the same material as that of the common layer 130 in accordance with an embodiment of the present invention.

The red emission layer 140, the green emission layer 150 and the blue emission layer 160 are respectively disposed on the red, green and blue pixel areas Rp, Gp and Bp, and may respectively include materials respectively emitting red, green and blue, and may be formed using a phosphor material or a fluorescent material.

The red emission layer 140 includes a host material that contains CBP (carbazole biphenyl) or mCP (1,3-bis(carbazol-9-yl), and may be made of, but not limited to, a phosphor material that includes a dopant that contains any one or more selected from a group of PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium) and PtOEP (octaethylporphyrin platinum), or may be made of, but not limited to, a fluorescent material that includes PBD:Eu(DBM)3(Phen) or Perylene.

The green emission layer 150 includes a host material that contains CBP or mCP, and may be made of a phosphor material that includes a dopant material such as Ir complex that contains Ir(ppy)3(fac tris(2-phenylpyridine)iridium). Unlike the above material, the green emission layer 150 may be made of, but not limited to, a fluorescent material that includes Alq3(tris(8-hydroxyquinolino)aluminum).

The blue emission layer 160 includes a host material that contains CBP or mCP, and may be made of a phosphor material that includes a dopant material that contains (4,6-F2ppy)2Irpic. Unlike the above materials, the blue emission layer 160 may be made of, but not limited to, a fluorescent material that includes any one selected from a group of spiro-DPVBi, spiro-6P, distilbenzene (DSB), distrilarylene (DSA), PFO based high polymer, and PPV based high polymer.

The electron transporting layer 170 is formed on the red emission layer 140, the green emission layer 150 and the blue emission layer 160. The thickness of the electron transporting layer 170 may be controlled considering electron transporting characteristics. Also, the electron transporting layer 170 may serve to transport and inject electrons. The electron injection layer 180 may be formed on the electron transporting layer separately.

The electron transporting layer 170 serves to actively transport electrons, and may be made of, but not limited to, any one or more selected from a group of Alq3(tris(8-hydroxyquinolino)aluminum), PBD, TAZ, spiro-PBD, BAlq, Liq (lithium quinolate), BMB-3T, PF-6P, TPBI, COT and SAlq.

The electron injection layer 180 may be made of, but not limited to, Alq3(tris(8-hydroxyquinolino)aluminum), PBD, TAZ, spiro-PBD, BAlq, or SAlq.

In this case, the structure of the organic light emitting device is not limited to the embodiment of the present invention, and at least one of the hole injection layer 120, the common layer 130, the first hole transporting layer 131, the second hole transporting layer 132, the electron transporting layer 170, and the electron injection layer 180 may be omitted and/or at least some of their functionalities can be combined into one or more existing layers. Also, at least one among the hole injection layer 120, the common layer 130, the first hole transporting layer 131, the second hole transporting layer 132, the electron transporting layer 170 and the electron injection layer 180 may be formed of two or more layers.

The second electrode 190 is formed on the electron injection layer 180. For example, the second electrode 190 may be made of, but not limited to, an alloy (Ag:Mg) of Ag and Mg, and may have transflective characteristics. That is, light from the organic light-emission layer is emitted through the second electrode 190, and some of the light is again emitted toward the first electrode 110 as the second electrode 190 has transflective characteristics.

In this way, repetitive reflections occur between the first electrode 110 and the second electrode 190, which act as reflective layers. This will be referred to as a micro cavity effect. That is, light is repeatedly reflected within a cavity between the first electrode 110 and the second electrode 190, whereby light efficiency is increased.

In addition, the first electrode 110 may be formed as a transmissive electrode, and the second electrode 190 may be formed as a reflective electrode, whereby the light from the organic light-emission layer may be emitted through the first electrode 110.

The capping layer 200 is intended to increase optical extraction effect, and may be made of any one among the material of the common layer 130, the material of the first hole transporting layer 131, the material of the second hole transporting layer 132 and the material of the electron transporting layer 170, and the host material of the red emission layer 140, the green emission layer 150 and the blue emission layer 160. Also, the capping layer 200 itself may be omitted in certain display device structures.

Figure 2:
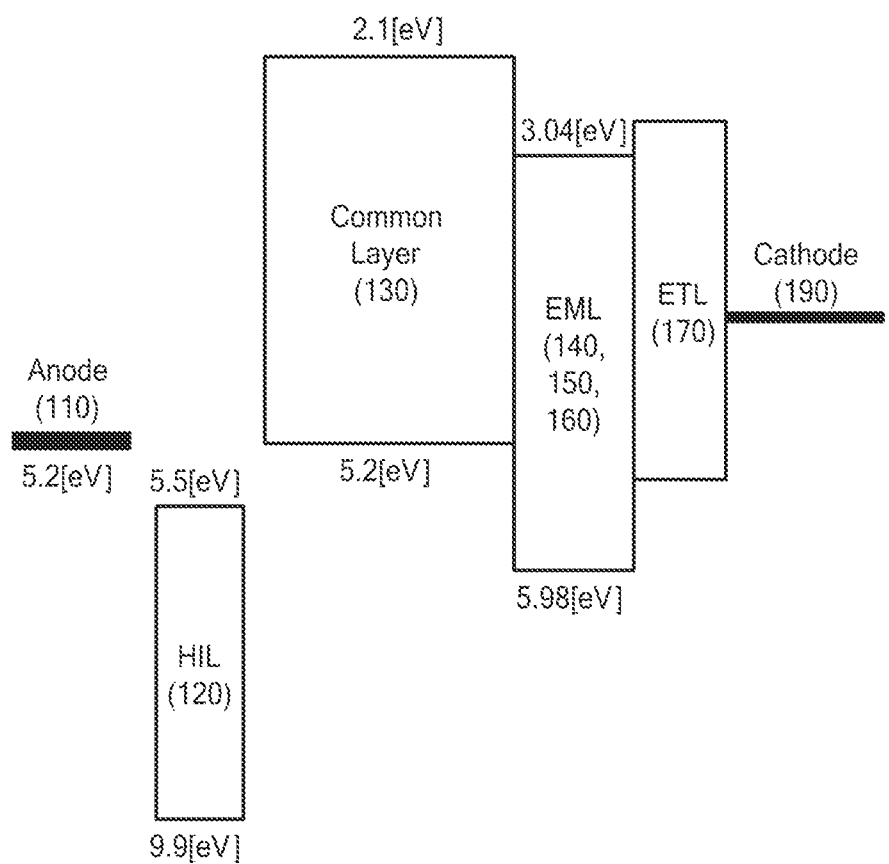
FIG. 2 is a view illustrating a band diagram of an organic light emitting device according to an embodiment of the present invention.

FIG. 2 is a view illustrating an energy band diagram of an organic light emitting device according to an embodiment of the present invention.

As shown in FIG. 2, in an organic light emitting device to which an N type hole injection layer 120 according to an embodiment of the present invention is applied, in view of energy barrier between the hole injection layer 120 and ITO which is the first electrode 110, a LUMO energy level of the hole injection layer 120 should be lower than or equal to an energy level of ITO which is the first electrode 110, that is, a work function of ITO.

Generally, when energy levels are expressed from an energy band diagram of the organic light emitting device, it may be more preferable that sizes of different energy levels may be compared with each other by using absolute values considering that values of the energy levels are negative numbers.

Therefore, if values of energy levels of the hole injection layer 120 and the first electrode 110 are compared with each other based on their absolute values, the absolute value of the LUMO energy level of the hole injection layer 120 should be larger than or equal to the absolute value of the energy level of ITO, that is, the work function of ITO. That is, a difference between the absolute value of the energy level of the hole injection layer 120 and the absolute value of the energy level of the first electrode 110 should be larger than or equal to 0.

The energy levels of the hole injection layer 120 and the first electrode 110 are set as above to actively inject and move holes by allowing charges generated at a charge generation part formed between the hole injection layer 120 and the common layer 130 to quickly move from a charge recombination part between the hole injection layer and the first electrode 110 to the first electrode 110, that is, ITO.

Also, in view of the energy barrier between the hole injection layer 120 and the common layer 130, the LUMO energy level of the hole injection layer 120 should be lower than or equal to the HOMO energy level of the common layer 130.

Likewise, if the values of the energy levels of the hole injection layer 120 and the common layer 130 are compared with each other based on their absolute values, the absolute value of the LUMO energy level of the hole injection layer 120 should be larger than or equal to the absolute value of the HOMO energy level of the common layer 130. That is, a difference between the absolute value of the energy level of the hole injection layer 120 and the absolute value of the energy level of the common layer should be larger than or equal to 0.

In case of the N type hole injection layer 120 that includes many groups, which bring electrons from the charge generation part formed between the hole injection layer 120 and the common layer 130, electrons move from the common layer 130 to the hole injection layer 120, whereby holes are generated.

If the energy level of the hole injection layer 120 is formed to be lower than the energy level of the common layer 130 to easily move electrons, charges may be generated actively, whereby holes may be generated and moved actively.

Assuming that the difference between the absolute value of the energy level of the hole injection layer 120 and the absolute value of the energy level of the first electrode 110 is $\Delta E1$ and the difference between the absolute value of the energy level of the hole injection layer 120 and the absolute value of the energy level of the common layer 130 is $\Delta E2$, holes may be injected more actively when the difference between $\Delta E1$ and $\Delta E2$ is not great.

Particularly, since an influence of charge generation is great, if the value of $\Delta E2-\Delta E1$ satisfies a value of 0 or more, that is, if the HOMO energy level of the common layer 130 is equal to or greater than the energy level of ITO when the HOMO energy level of the common layer 130 is compared with the energy level of ITO, that is, the work function of ITO, which is the first electrode 110, charges may be generated and transported actively, whereby the organic light emitting device may be driven at a low voltage.

In other words, if the difference between the absolute value of the energy level of the hole injection layer 120 and the absolute value of the energy level of the common layer 130 is larger than or equal to the difference between the absolute value of the energy level of the hole injection layer 120 and the absolute value of the energy level of the first electrode 110, the driving voltage of the organic light emitting device may be lowered.

This is because charges may quickly be generated and moved quickly by active recombination at the electrode to reduce the driving voltage when a condition for effectively generating charges in the charge generation part is made.

Therefore, a material having a HOMO energy level larger than 5.2 eV, the energy level of ITO which is the first electrode 110, and a LUMO energy level larger than 2.3 eV, the energy level of ITO, should be applied to the common layer 130 applied to the organic light emitting device of the present invention, whereby the common layer 130 may simultaneously serve as the hole transporting layer (HTL) and the electron blocking layer (EBL).

In this case, there is no limitation in the LUMO energy level of the N type hole injection layer 120, and a material having a LUMO energy level between 5.2 eV and 5.7 eV may generally be applied to the N type hole injection layer 120.

Figures 3, 4:
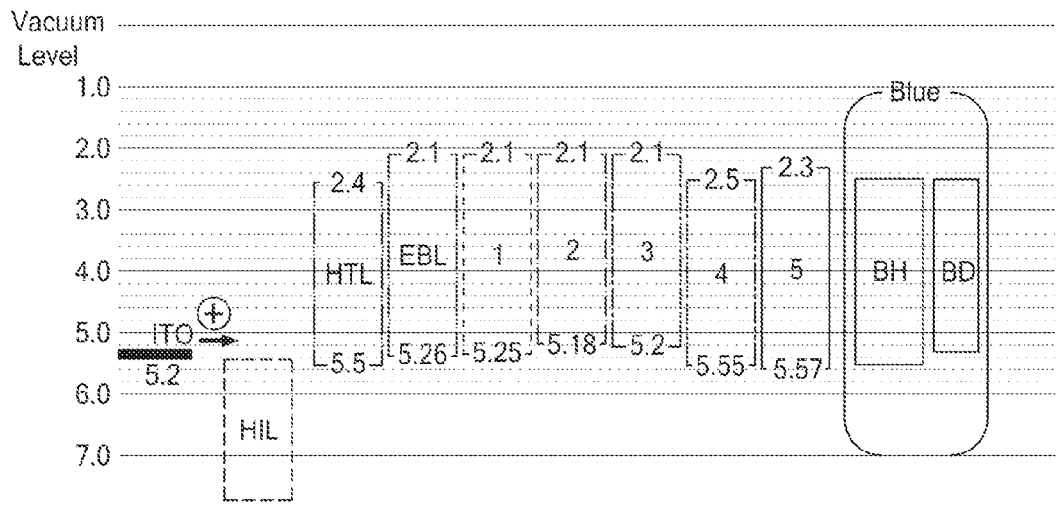
FIG. 3 is a view illustrating an energy diagram of a common layer of a blue organic light emitting device based on common layer conditions according to an embodiment of the present invention.
FIG. 4 is a view illustrating a result of electro-optic characteristic evaluation of a blue organic light emitting device per condition based on common layer conditions according to an embodiment of the present invention.

FIG. 3 is a view illustrating an energy diagram of a common layer of a blue organic light emitting device based on common layer conditions according to an embodiment of the present invention. In FIG. 3, BH denotes a host material of the blue emission layer 160, and BD denotes a dopant material of the blue emission layer 160.

In more detail, FIG. 3 illustrates a HOMO energy level condition and a LUMO energy level condition of the common layer 130 applied to a blue organic light emitting device to compare and evaluate electro-optic characteristics and lifetimes between a comparative example to which the hole transporting layer (HTL) and the electron blocking layer (EBL) are applied and the embodiments 1, 2, 3, 4 and 5 to which the common layer 130 serving as the hole transporting layer (HTL) and the electron blocking layer (EBL) are applied.

A structure of the blue organic light emitting device according to the comparative example will be described as follows.

After ITO was formed as the first electrode 110 at a thickness of 70 Å and Ag—Pd—Cu alloy (APC) was formed on the ITO at a thickness of 100 Å, ITO was formed on the alloy at a thickness of 70 Å. Afterwards, the first electrode 110 was subjected to surface treatment under the condition of N2 plasma.

HATCN was formed on the first electrode 110 as the hole injection layer 120 at a thickness of 70 Å and NPB was formed on the HATCN as the hole transporting layer (HTL) at a thickness of 1000 Å. Then, amine based organic material was formed on the NPB as the electron blocking layer (EBL) at a thickness of 150 Å.

Anthracene derivative was formed on the electron blocking layer (EBL) as the blue emission layer 160 at a thickness of 200 Å, and then a dopant was doped at a level of 5%. A mixture of anthracene derivative and Liq (lithium quinolate) of a ratio of 1:1 was formed on the blue emission layer 160 as the electron transporting layer 170 at a thickness of 300 Å.

The Ag and Mg alloy (Ag:Mg) obtained by mixture of Ag and Mg at a ratio of 1:1 was formed as the second electrode 190 at a thickness of 200 Å, wherein the Ag and Mg alloy is a semi-transmissive electrode. Then, the second electrode 190 was encapsulated by a glass substrate, whereby the blue organic light emitting device was fabricated.

Also, a structure of the blue organic light emitting device according to the embodiment 1 will be described as follows.

After ITO was formed as the first electrode 110 at a thickness of 70 Å and Ag—Pd—Cu alloy (APC) was formed on the ITO at a thickness of 100 Å, ITO was formed on the alloy at a thickness of 70 Å. Afterwards, the first electrode 110 was subjected to surface treatment under the condition of N2 plasma.

HATCN was formed on the first electrode 110 as the hole injection layer 120 at a thickness of 70 Å, and Spiro amine based organic material having a HOMO energy level and a LUMO energy level of a common layer 1 of Table 1 below was formed on the hole injection layer 120 as the common layer 130 at a thickness of 1150 Å.

Anthracene derivative was formed on the common layer 130, that is, the common layer 1 as the blue emission layer 160 at a thickness of 200 Å, and then a dopant was doped at a level of 5%. A mixture of anthracene derivative and Liq (lithium quinolate) of a ratio of 1:1 was formed on the blue emission layer 160 as the electron transporting layer 170 at a thickness of 300 Å.

The Ag and Mg alloy (Ag:Mg) obtained by mixture of Ag and Mg at a ratio of 1:1 was formed on the electron transporting layer 170 as the second electrode 190 at a thickness of 200 Å, wherein the Ag and Mg alloy is a semi-transmissive electrode. Then, the second electrode 190 was encapsulated by a glass substrate, whereby the blue organic light emitting device was fabricated.

Also, a structure of the blue organic light emitting device according to the embodiment 2 will be described as follows.

After ITO was formed as the first electrode 110 at a thickness of 70 Å and Ag—Pd—Cu alloy (APC) was formed on the ITO at a thickness of 100 Å, ITO was formed on the alloy at a thickness of 70 Å. Afterwards, the first electrode 110 was subjected to surface treatment under the condition of N2 plasma.

HATCN was formed on the first electrode 110 as the hole injection layer 120 at a thickness of 70 Å, and Spiro amine based organic material having a HOMO energy level and a LUMO energy level of a common layer 2 of Table 1 below was formed on the hole injection layer 120 as the common layer 130 at a thickness of 1150 Å.

Anthracene derivative was formed on the common layer 130, that is, the common layer 2 as the blue emission layer 160 at a thickness of 200 Å, and then a dopant was doped at a level of 5%. A mixture of anthracene derivative and Liq (lithium quinolate) of a ratio of 1:1 was formed on the blue emission layer 160 as the electron transporting layer 170 at a thickness of 300 Å.

The Ag and Mg alloy (Ag:Mg) obtained by mixture of Ag and Mg at a ratio of 1:1 was formed on the electron transporting layer 170 as the second electrode 190 at a thickness of 200 Å, wherein the Ag and Mg alloy is a semi-transmissive electrode. Then, the second electrode 190 was encapsulated by a glass substrate, whereby the blue organic light emitting device was fabricated.

Also, a structure of the blue organic light emitting device according to the embodiment 3 will be described as follows.

After ITO was formed as the first electrode 110 at a thickness of 70 Å and Ag—Pd—Cu alloy (APC) was formed on the ITO at a thickness of 100 Å, ITO was formed on the alloy at a thickness of 70 Å. Afterwards, the first electrode 110 was subjected to surface treatment under the condition of N2 plasma.

HATCN was formed on the first electrode 110 as the hole injection layer 120 at a thickness of 70 Å, and Spiro amine based organic material having a HOMO energy level and a LUMO energy level of a common layer 3 of Table 1 below was formed on the hole injection layer 120 as the common layer 130 at a thickness of 1150 Å.

Anthracene derivative was formed on the common layer 130, that is, the common layer 3 as the blue emission layer 160 at a thickness of 200 Å, and then a dopant was doped at a level of 5%. A mixture of anthracene derivative and Liq (lithium quinolate) of a ratio of 1:1 was formed on the blue emission layer 160 as the electron transporting layer 170 at a thickness of 300 Å.

The Ag and Mg alloy (Ag:Mg) obtained by mixture of Ag and Mg at a ratio of 1:1 was formed on the electron transporting layer 170 as the second electrode 190 at a thickness of 200 Å, wherein the Ag and Mg alloy is a semi-transmissive electrode. Then, the second electrode 190 was encapsulated by a glass substrate, whereby the blue organic light emitting device was fabricated.

Also, a structure of the blue organic light emitting device according to the embodiment 4 will be described as follows.

After ITO was formed as the first electrode 110 at a thickness of 70 Å and Ag—Pd—Cu alloy (APC) was formed on the ITO at a thickness of 100 Å, ITO was formed on the alloy at a thickness of 70 Å. Afterwards, the first electrode 110 was subjected to surface treatment under the condition of N2 plasma.

HATCN was formed on the first electrode 110 as the hole injection layer 120 at a thickness of 70 Å, and Spiro amine based organic material having a HOMO energy level and a LUMO energy level of a common layer 4 of Table 1 below was formed on the hole injection layer 120 as the common layer 130 at a thickness of 1150 Å.

Anthracene derivative was formed on the common layer 130, that is, the common layer 4 as the blue emission layer 160 at a thickness of 200 Å, and then a dopant was doped at a level of 5%. A mixture of anthracene derivative and Liq (lithium quinolate) of a ratio of 1:1 was formed on the blue emission layer 160 as the electron transporting layer 170 at a thickness of 300 Å.

The Ag and Mg alloy (Ag:Mg) obtained by mixture of Ag and Mg at a ratio of 1:1 was formed on the electron transporting layer 170 as the second electrode 190 at a thickness of 200 Å, wherein the Ag and Mg alloy is a semi-transmissive electrode. Then, the second electrode 190 was encapsulated by a glass substrate, whereby the blue organic light emitting device was fabricated.

Also, a structure of the blue organic light emitting device according to the embodiment 5 will be described as follows.

After ITO was formed as the first electrode 110 at a thickness of 70 Å and Ag—Pd—Cu alloy (APC) was formed on the ITO at a thickness of 100 Å, ITO was formed on the alloy at a thickness of 70 Å. Afterwards, the first electrode 110 was subjected to surface treatment under the condition of N2 plasma.

HATCN was formed on the first electrode 110 as the hole injection layer 120 at a thickness of 70 Å, and Spiro amine based organic material having a HOMO energy level and a LUMO energy level of a common layer 5 of Table 1 below was formed on the hole injection layer 120 as the common layer 130 at a thickness of 1150 Å.

Anthracene derivative was formed on the common layer 130, that is, the common layer 5 as the blue emission layer 160 at a thickness of 200 Å, and then a dopant was doped at a level of 5%. A mixture of anthracene derivative and Liq (lithium quinolate) of a ratio of 1:1 was formed on the blue emission layer 160 as the electron transporting layer 170 at a thickness of 300 Å.

The Ag and Mg alloy (Ag:Mg) obtained by mixture of Ag and Mg at a ratio of 1:1 was formed on the electron transporting layer 170 as the second electrode 190 at a thickness of 200 Å, wherein the Ag and Mg alloy is a semi-transmissive electrode. Then, the second electrode 190 was encapsulated by a glass substrate, whereby the blue organic light emitting device was fabricated.

The work function 5.2 eV of ITO which is the first electrode 110 in FIG. 3 means a level of a work function that may be generated after ITO is subjected to surface treatment under the condition of N2 plasma.

The following Table 1 illustrates HOMO energy levels and LUMO energy levels of the hole transporting layer (HTL), the electron blocking layer (EBL) and the common layer 130 in the comparative example and the embodiments 1, 2, 3, 4 and 5. The HOMO energy level of HATCN formed as the hole injection layer 120 is 9.9 eV and its LUMO energy level is 5.5 eV.

higher than 5.5 eV which is the LUMO energy level of the hole injection layer 120 was used as the common layer.

Also, a HOMO energy level of the common layer 2 which is the common layer 130 of the embodiment 2 is 5.18 eV and its LUMO energy level is 2.1 eV. A material having a HOMO energy level higher than the work function 5.2 eV of ITO which is the first electrode and a LUMO energy level higher than 5.5 eV which is the LUMO energy level of the hole injection layer 120 was used as the common layer.

Also, a HOMO energy level of the common layer 3 which is the common layer 130 of the embodiment 3 is 5.2 eV and its LUMO energy level is 2.1 eV. A material having a HOMO energy level equal to the work function 5.2 eV of ITO which is the first electrode and a LUMO energy level higher than 5.5 eV which is the LUMO energy level of the hole injection layer 120 was used as the common layer.

Also, a HOMO energy level of the common layer 4 which is the common layer 130 of the embodiment 4 is 5.55 eV and its LUMO energy level is 2.5 eV. A material having a HOMO energy level lower than the work function 5.2 eV of ITO which is the first electrode and a LUMO energy level lower than 5.5 eV which is the LUMO energy level of the hole injection layer 120 and lower than the LUMO energy level 2.1 eV of the electron blocking layer (EBL) was used as the common layer.

Also, a HOMO energy level of the common layer 5 which is the common layer 130 of the embodiment 5 is 5.57 eV and its LUMO energy level is 2.3 eV. A material having a HOMO energy level lower than the work function 5.2 eV of ITO which is the first electrode and a LUMO energy level lower than 5.5 eV which is the LUMO energy level of the hole injection layer 120 and lower than the LUMO energy level 2.1 eV of the electron blocking layer (EBL) was used as the common layer.

The blue organic light emitting device was fabricated using the conditions of the common layer 130 in the aforementioned comparative example and embodiments 1, 2, 3, 4 and 5, and electro-optic characteristics and lifetime characteristics of the organic light emitting device in the compara-

TABLE 1

[Unit: eV]

| Classification | Comparative example | | Embodiment 1 | Embodiment 2 | Embodiment 3 | Embodiment 4 | Embodiment 5 |
|---|---|---|---|---|---|---|---|
| Structure | HTL | EBL | Common layer 1 | Common layer 2 | Common layer 3 | Common layer 4 | Common layer 5 |
| HOMO energy level | 5.5 | 5.26 | 5.25 | 5.18 | 5.2 | 5.55 | 5.57 |
| LUMO energy level | 2.4 | 2.1 | 2.1 | 2.1 | 2.1 | 2.5 | 2.3 |

Referring to Table 1, a material having a HOMO energy level of 5.5 eV and a LUMO energy level of 2.4 eV was used as the hole transporting layer (HTL) in the comparative example. And, a material having a HOMO energy level of 5.26 eV and a LUMO energy level of 2.1 eV was used as the electron blocking layer (EBL) in the comparative example.

Also, a HOMO energy level of the common layer 1 which is the common layer 130 of the embodiment 1 is 5.25 eV and its LUMO energy level is 2.1 eV. A material having a HOMO energy level lower than the work function 5.2 eV of ITO which is the first electrode and a LUMO energy level tive example and embodiments 1, 2, 3, 4 and 5 were evaluated and then the results were compared with one another.

FIG. 4 is a view illustrating a result of electro-optic characteristic evaluation of a blue organic light emitting device per condition based on common layer conditions according to an embodiment of the present invention.

In more detail, FIG. 4 illustrates the result of electro-optic characteristic evaluation of a driving voltage V, luminescence efficiency cd/A, color coordinates (CIE_x, CIE_y) and external quantum efficiency (EQE (%)) in the blue organic light emitting device to which the conditions of the comparative example and the common layer 130 of the embodiments 1, 2, 3, 4 and 5 are applied.

As shown in FIG. 4, it is noted that there is no great difference in the result of electro-optic characteristic between the comparative example and the embodiments 1, 2, 3, 4 and 5 in view of color coordinates (CIE_x, CIE_y) and quantum efficiency (EQE (%)).

However, in view of the driving voltage, it is noted that the driving voltage is 4.2V in the comparative example in which the hole transporting layer (HTL) and the electron blocking layer (EBL) are respectively formed.

In case of the embodiments 1, 4 and 5 to which the common layer 130 having the HOMO energy level lower than the energy level of any one of ITO, which is the first electrode 110, and the hole injection layer 120 is applied, the driving voltages are respectively 4.2V, 4.2V and 4.3V. It is noted that the driving voltages of the embodiments 1, 4 and 5 are similar to that of the comparative example and are not lowered as compared with the comparative example.

In contrast, in case of the embodiment 2 to which the common layer 130 having the HOMO energy level higher than the energy levels of ITO, which is the first electrode 110, and the hole injection layer 120 is applied, and the embodiment 3 to which the common layer 3 which is the common layer 130 having the HOMO energy level equal to or higher than the energy levels of ITO, which is the first electrode 110, and the hole injection layer 120 is applied, the driving voltages are respectively 3.7V and 3.8V. It is noted that the driving voltages of the embodiments 2 and 3 are lowered as compared with the comparative example and the embodiments 1, 4 and 5.

Also, in view of luminescence efficiency, particularly in the embodiment 4 to which the common layer 4 is applied as the common layer 130, it is noted that the LUMO energy level of the common layer 4 is 2.5 eV and is lower than the LUMO energy level 2.1 eV of the electron blocking layer (EBL) of the comparative example, whereby the common layer 130 does not serve as the electron blocking layer (EBL) and thus luminescence efficiency is deteriorated.

In contrast, in the embodiment 5 to which the common layer 5 is applied as the common layer 130, it is noted that the LUMO energy level of the common layer 5 is 2.3 eV and is similar to the comparative example in view of luminescence efficiency, whereby the common layer 130 serves as the electron blocking layer (EBL).

Therefore, in the organic light emitting device to which the N type hole injection layer 120 is applied like an embodiment of the present invention, it is noted that excellent characteristics in view of the driving voltage may be obtained if the common layer 130 having the HOMO energy level higher than the work function of ITO which is the first electrode 110 and the LUMO energy level of the hole injection layer 120 is used.

Also, it is noted that the common layer 130 serves as the electron blocking layer (EBL) when the LUMO energy level of the common layer 130 is higher than 2.3 eV.

That is, the difference between the absolute value of the energy level of the hole injection layer 120 and the absolute value of the energy level of the first electrode 110 should be larger than or equal to 0. Also, the difference between the absolute value of the energy level of the hole injection layer 120 and the absolute value of the energy level of the common layer should be larger than or equal to 0.

Also, when the difference between the absolute value of the energy level of the hole injection layer 120 and the absolute value of the energy level of the common layer 130 is larger than or equal to the difference between the absolute value of the energy level of the hole injection layer 120 and the absolute value of the energy level of the first electrode 110, it is possible to obtain the advantage that the driving voltage of the organic light emitting device is lowered.

If the material of which HOMO energy level is larger than the energy level of ITO which is the first electrode 110, that is, 5.2 eV which is the work function of ITO and LUMO energy level is larger than 2.3 eV is applied to the common layer 130, it is noted that the common layer 130 may simultaneously serve as the hole transporting layer (HTL) and the electron blocking layer (EBL).

Figures 5, 6, 7:
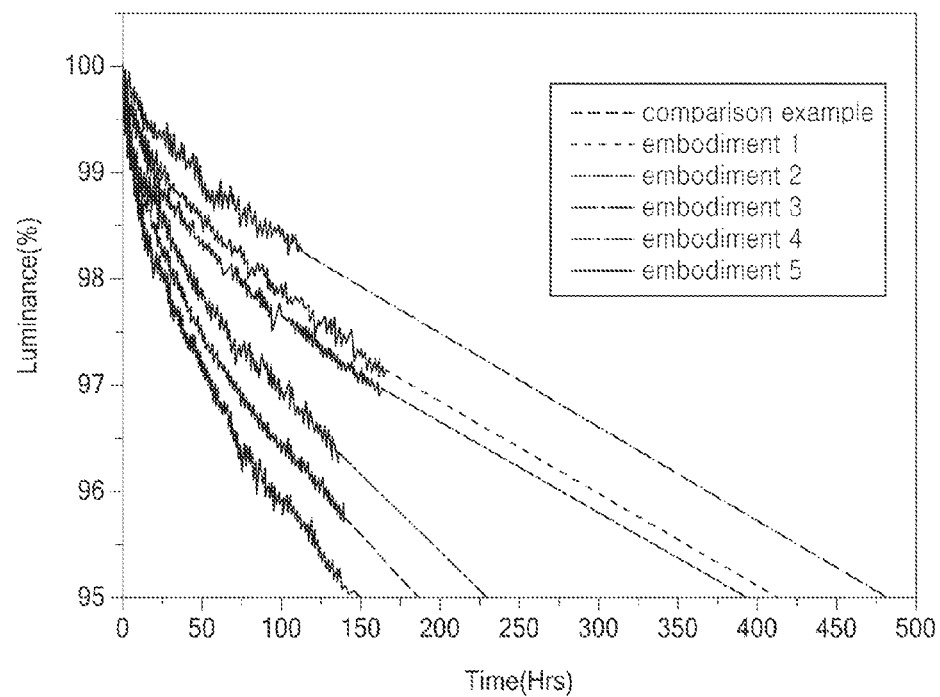
FIG. 5 is a view illustrating a result of lifetime characteristic evaluation of a blue organic light emitting device per condition based on common layer conditions according to an embodiment of the present invention.
FIG. 6 is a view illustrating a result of electro-optic characteristic experiment of a red organic light emitting device per condition based on common layer conditions according to an embodiment of the present invention.
FIG. 7 is a view illustrating a result of electro-optic characteristic experiment of a green organic light emitting device per condition based on common layer conditions according to an embodiment of the present invention.

FIG. 5 is a view illustrating a result of lifetime characteristic evaluation of a blue organic light emitting device per condition based on common layer conditions according to an embodiment of the present invention.

As shown in FIG. 5, in case of the result of lifetime evaluation in the embodiments 4 and 5, the time required to generate luminescence luminance corresponding to 95% of initial luminescence luminance, that is, 95% lifetime of the organic light emitting device, is represented at 225 hours in the embodiment 4 and represented at 150 hours in the embodiment 5. There was no great difference between the 95% lifetime of the organic light emitting device in the embodiments 4 and 5 and 180 hours, which is the 95% time in the comparative example and there was no result that lifetime of the organic light emitting device is improved as compared with the comparative example.

In other words, the result of lifetime of the device in the embodiments 4 and 5 in which the HOMO energy level of the common layer 130 is lower than the work function of ITO which is the first electrode 110 and lower than the LUMO energy level of the hole injection layer 120 was not improved as compared with the result of lifetime of the comparative example.

In contrast, as shown in FIG. 5, in case of the result of lifetime of the device in the embodiments 1, 2 and 3, the time required to generate luminescence luminance corresponding to 95% of initial luminescence luminance, that is, 95% lifetime of the organic light emitting device, is represented at 415 hours in the embodiment 1, represented at 475 hours in the embodiment 2 and represented at 395 hours in the embodiment 3.

In other words, the result showed that lifetime of the organic light emitting device in the embodiments 1, 2 and 3 was improved to about twice or more as compared to 180 hours, which is the 95% lifetime of the comparative example.

Upon review of the above result, especially in the embodiments 2 and 3, in which the HOMO energy level of the common layer 130 simultaneously serving as the hole transporting layer (HTL) and the electron blocking layer (EBL) is higher than or equal to the work function of ITO which is the first electrode 110 and higher than the LUMO energy level of the hole injection layer 120, it is noted that lifetime was improved as compared with the result of lifetime of the comparative example.

Therefore, in order to improve lifetime of the organic light emitting device by using the common layer 130, the HOMO energy level of the common layer 130 should be higher than the LUMO energy level of the hole injection layer 120 to quickly inject holes without problem in charge generation.

In other words, it is noted that lifetime of the organic light emitting device has excellent characteristic when the absolute value of the LUMO energy level of the hole injection layer 120 is larger than or equal to the absolute value of the HOMO energy level of the common layer 130.

FIG. 6 is a view illustrating a result of electro-optic characteristic experiment of a red organic light emitting device per condition based on common layer conditions according to an embodiment of the present invention.

In FIG. 6, in the red organic light emitting device, electro-optic characteristics were evaluated and compared between the embodiment 1 to which the common layer 1 in Table 1 is applied as the common layer 130 and the embodiment 2 to which the common layer 2 in Table 1 is applied as the common layer 130.

A structure of the red organic light emitting device according to the embodiment 1 will be described as follows.

ITO was formed as the first electrode 110 at a thickness of 70 Å, Ag—Pd—Cu alloy (APC) was formed on the ITO at a thickness of 100 Å, and ITO was formed on the alloy at a thickness of 70 Å. Afterwards, the first electrode 110 was subjected to surface treatment under the condition of N2 plasma.

HATCN was formed on the first electrode 110 as the hole injection layer 120 at a thickness of 70 Å, and Spiro amine based organic material having the HOMO energy level and the LUMO energy level of the common layer 1 of Table 1 was formed on the hole injection layer 120 as the common layer 130 at a thickness of 1150 Å.

Beryllium complex derivative was formed on the common layer 130, that is, the common layer 1 as the red emission layer 140 at a thickness of 350 Å, and then a dopant was doped at a level of 5%. A mixture of anthracene derivative and Liq (lithium quinolate) of a ratio of 1:1 was formed on the red emission layer 140 as the electron transporting layer 170 at a thickness of 300 Å.

The Ag and Mg alloy (Ag:Mg) obtained by mixture of Ag and Mg at a ratio of 1:1 was formed on the electron transporting layer 170 as the second electrode 190 at a thickness of 200 Å, wherein the Ag and Mg alloy is a semi-transmissive electrode. Then, the second electrode 190 was encapsulated by a glass substrate, whereby the red organic light emitting device was fabricated.

Also, a structure of the red organic light emitting device according to the embodiment 2 will be described as follows.

ITO was formed as the first electrode 110 at a thickness of 70 Å, Ag—Pd—Cu alloy (APC) was formed on the ITO at a thickness of 100 Å, and ITO was formed on the alloy at a thickness of 70 Å. Afterwards, the first electrode 110 was subjected to surface treatment under the condition of N2 plasma.

HATCN was formed on the first electrode 110 as the hole injection layer 120 at a thickness of 70 Å, and Spiro amine based organic material having the HOMO energy level and the LUMO energy level of the common layer 2 of Table 1 was formed on the hole injection layer 120 as the common layer 130 at a thickness of 1150 Å.

Beryllium complex derivative was formed on the common layer 130, that is, the common layer 2 as the red emission layer 140 at a thickness of 350 Å, and then a dopant was doped at a level of 5%. A mixture of anthracene derivative and Liq (lithium quinolate) of a ratio of 1:1 was formed on the red emission layer 140 as the electron transporting layer 170 at a thickness of 300 Å.

The Ag and Mg alloy (Ag:Mg) obtained by mixture of Ag and Mg at a ratio of 1:1 was formed on the electron transporting layer 170 as the second electrode 190 at a thickness of 200 Å, wherein the Ag and Mg alloy is a semi-transmissive electrode. Then, the second electrode 190 was encapsulated by a glass substrate, whereby the red organic light emitting device was fabricated.

Electro-optic characteristics of the red organic light emitting device to which the common layers 130 of the embodiments 1 and 2 are applied were evaluated in accordance with the aforementioned structures and the evaluated results were compared with each other.

As shown in FIG. 6, when the results of electro-optic characteristics in the embodiments 1 and 2 are compared with each other, it is noted that there was no great difference between the embodiments 1 and 2 in view of luminescence efficiency cd/A, color coordinates (CIE_x, CIE_y) and quantum efficiency (EQE (%)).

In contrast, in view of the driving voltage, it is noted that the driving voltage is 4.7V in the embodiment 1 to which the common layer 1 is applied as the common layer 130, and the driving voltage is 4.0V in the embodiment 2 to which the common layer 2 is applied as the common layer 130. As a result, it is noted that more improved effect may be obtained in view of the driving voltage in the embodiment 2 to which the common layer 2 is applied as the common layer 130.

In other words, it is noted that the driving voltage in the red organic light emitting device is lowered in the embodiment 2 to which the common layer 2 having the HOMO energy level higher than the work function of ITO which is the first electrode 110 is applied as the common layer 130.

FIG. 7 is a view illustrating a result of electro-optic characteristic experiment of a green organic light emitting device per condition based on common layer conditions according to an embodiment of the present invention.

In FIG. 7, in the green organic light emitting device in which the green emission layer 150 is formed by the same device structure as that of the aforementioned experiments of the blue organic light emitting device and the red organic light emitting device, electro-optic characteristics were evaluated and compared between the embodiment 1 to which the common layer 1 is applied as the common layer 130 and the embodiment 2 to which the common layer 2 is applied as the common layer 130.

As shown in FIG. 7, it is noted that there was no great difference in the result of electro-optic characteristics between the embodiments 1 and 2 in view of luminescence efficiency (cd/A), color coordinates (CIE_x, CIE_y) and quantum efficiency (EQE (%)).

In contrast, in view of the driving voltage, it is noted that the driving voltage is 4.6V in the embodiment 1 to which the common layer 1 is applied as the common layer 130, and the driving voltage is 3.9V in the embodiment 2 to which the common layer 2 is applied as the common layer 130. As a result, it is noted that more improved effect may be obtained in view of the driving voltage in the embodiment 2 to which the common layer 2 is applied as the common layer 130.

In other words, it is noted that the driving voltage in the green organic light emitting device is lowered in the embodiment 2 to which the common layer 2 having the HOMO energy level higher than the work function of ITO which is the first electrode 110 is applied as the common layer 130.

As a result, referring to the result of experiments of the red and green organic light emitting devices in FIGS. 6 and 7, in the same manner as the result of the aforementioned experiment of the blue organic light emitting device, it is noted that the driving voltage may be lowered and lifetime may be improved in the red and green organic light emitting devices to which the common layer 130 having a HOMO energy level higher than the work function of ITO which is the first electrode 110 is applied.

The first hole transporting layer 131 corresponding to the red emission layer 140 and the second hole transporting layer 132 corresponding to the green emission layer 150 may additionally be applied to the organic light emitting device according to an embodiment of the present invention, if the first hole transporting layer 131 and the second hole transporting layer 132 are formed of the same material as that of the common layer 130, it is possible to additionally lower the driving voltage of the organic light emitting device and also improve lifetime of the organic light emitting device.

The organic light emitting device may include the organic light emitting layer disposed between the first electrode and the second electrode, the hole injection layer adjacent to the first electrode, and the common layer disposed on the hole injection layer, wherein the common layer may serve as a hole transporting layer and an electron blocking layer.

The difference between the absolute value of the energy level of the hole injection layer and the absolute value of the energy level of the first electrode may be larger than or equal to 0.

The difference between the absolute value of the energy level of the hole injection layer and the absolute value of the energy level of the common layer may be larger than or equal to 0.

The difference between the absolute value of the energy level of the hole injection layer and the absolute value of the energy level of the common layer may be larger than or equal to the difference between the absolute value of the energy level of the hole injection layer and the absolute value of the energy level of the first electrode.

The hole injection layer may be made of an N type organic material, and the first electrode may be ITO (Indium Tin Oxide).

The HOMO (Highest Occupied Molecular Orbital) energy level of the common layer may be higher than or equal to the work function of the first electrode.

The HOMO energy level of the common layer may be higher than 5.2 eV.

The LUMO (Lowest Unoccupied Molecular Orbital) energy level of the common layer may be higher than 2.3 eV.

The organic light emitting device may include the first hole transporting layer corresponding to the red emission layer and the second hole transporting layer corresponding to the green emission layer, wherein each of the first hole transporting layer and the second hole transporting layer may be made of the same material as that of the common layer.

As described above, according to the present invention, the following advantages may be obtained.

In the organic light emitting device to which the N type hole injection layer according to an embodiment of the present invention is applied, the common layer serving as the hole transporting layer and the electron blocking layer is applied to actively inject holes to the organic light emitting layer, whereby the driving voltage of the organic light emitting device may be lowered. Also, degradation at the interface may be prevented from occurring, whereby lifetime of the organic light emitting device may be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
    a first electrode and a second electrode;
    an organic light emitting layer between the first electrode and the second electrode, including a red emission layer, a green emission layer, and a blue emission layer;
    a hole injection layer on the first electrode;
    a common layer serving as a hole transporting layer and an electron blocking layer;
    a first hole transporting layer between the red emission layer and the common layer; and
    a second hole transporting layer between the green emission layer and the common layer,
    wherein the common layer is disposed on the hole injection layer and underneath the first hole transporting layer, the second hole transporting layer, and the blue emission layer.

2. The organic light emitting device of claim 1, wherein a difference between an absolute value of an energy level of the hole injection layer and an absolute value of an energy level of the first electrode is larger than or equal to 0.

3. The organic light emitting device of claim 2, wherein a difference between the absolute value of the energy level of the hole injection layer and an absolute value of an energy level of the common layer is larger than or equal to 0.

4. The organic light emitting device of claim 3, wherein the difference between the absolute value of the energy level of the hole injection layer and the absolute value of the energy level of the common layer is larger than or equal to the difference between the absolute value of the energy level of the hole injection layer and the absolute value of the energy level of the first electrode.

5. The organic light emitting device of claim 4, wherein the hole injection layer is formed of an N type organic material.

6. The organic light emitting device of claim 5, wherein the first electrode is formed of ITO (Indium Tin Oxide).

7. An organic light emitting device comprising:
    a first electrode and a second electrode;
    an organic light emitting layer arranged between the first electrode and the second electrode, including a red emission layer, a green emission layer, and a blue emission layer;
    a hole injection layer on the first electrode;
    a common layer transporting holes and blocking electrons;
    a first hole transporting layer between the red emission layer and the common layer;
    a second hole transporting layer between the green emission layer and the common layer,
    wherein the common layer has a HOMO (Highest Occupied Molecular Orbital) energy level higher than or equal to a work function of the first electrode,
    wherein the common layer serves as a hole transporting layer and an electron blocking layer, and
    wherein the common layer is disposed on the hole injection layer and underneath the first hole transporting layer, the second hole transporting layer, and the blue emission layer.

8. The organic light emitting device of claim 7, wherein the HOMO energy level of the common layer is higher than 5.2 eV.

9. The organic light emitting device of claim 8, wherein a LUMO (Lowest Unoccupied Molecular Orbital) energy level of the common layer is higher than 2.3 eV.

10. The organic light emitting device of claim 7, wherein the hole injection layer is formed of an N type organic material.

11. The organic light emitting device of claim 7, wherein the first electrode is formed of ITO (Indium Tin Oxide).

12. An organic light emitting device comprising:
a first electrode and a second electrode;
an organic light emitting layer between the first and the second electrode, including a red emission layer, a green emission layer, and a blue emission layer;
a hole injection layer on the first electrode; and
a common layer between the organic light emitting layer and the hole injection layer;
a first hole transporting layer corresponding to the red emission layer; and
a second hole transporting layer corresponding to the green emission layer,
wherein the common layer has a HOMO (Highest Occupied Molecular Orbital) energy level higher than or equal to a work function of the first electrode,
wherein the common layer serves as a hole transporting layer and an electron blocking layer, and
wherein the common layer is disposed on the hole injection layer and underneath all of the red emission layer, the green emission layer, and the blue emission layer.

13. The organic light emitting device of claim 12, wherein each of the first hole transporting layer and the second hole transporting layer is formed of a same material as that of the common layer.

14. The organic light emitting device of claim 13, wherein the HOMO energy level of the common layer is higher than 5.2 eV.

15. The organic light emitting device of claim 13, wherein a LUMO (Lowest Unoccupied Molecular Orbital) energy level of the common layer is higher than 2.3 eV.

16. The organic light emitting device of claim 15, wherein the hole injection layer is formed of an N type organic material.

17. The organic light emitting device of claim 16, wherein the first electrode is formed of ITO (Indium Tin Oxide).

* * * * *